(12) United States Patent
Ko

(10) Patent No.: US 11,753,839 B2
(45) Date of Patent: Sep. 12, 2023

(54) COMBINATION TYPE SHIELDING STRUCTURE

(71) Applicant: Wen-Shan Ko, Changhua County (TW)

(72) Inventor: Wen-Shan Ko, Changhua County (TW)

(*) Notice: Subject to any disclaimer, the term of this patent is extended or adjusted under 35 U.S.C. 154(b) by 0 days.

(21) Appl. No.: 17/075,259

(22) Filed: Oct. 20, 2020

(65) Prior Publication Data

US 2021/0148128 A1 May 20, 2021

(30) Foreign Application Priority Data

Nov. 18, 2019 (TW) .................................. 108215246

(51) Int. Cl.
*E04H 1/12* (2006.01)
*E04H 1/14* (2006.01)
*E06B 5/10* (2006.01)

(52) U.S. Cl.
CPC ................ *E04H 1/14* (2013.01); *E06B 5/10* (2013.01)

(58) Field of Classification Search
CPC ..... E04H 1/125; E04H 1/1255; E04H 1/1261; E04H 1/1266; E04H 2001/1294; E04H 1/14; E04H 1/12; E04B 5/10
USPC .............................................. 52/27.5, 169.6
See application file for complete search history.

(56) References Cited

U.S. PATENT DOCUMENTS

| | | | | |
|---|---|---|---|---|
| 1,908,661 | A * | 5/1933 | Foltz | E04H 1/14 D25/16 |
| 5,029,339 | A * | 7/1991 | Caron | E04H 1/14 379/453 |
| 8,407,946 | B1 * | 4/2013 | Aaron | E04H 1/1266 52/36.2 |
| 10,907,370 | B1 * | 2/2021 | Waskey | E04B 1/82 |
| 2002/0046422 | A1 * | 4/2002 | Perett | E04H 1/125 4/524 |
| 2019/0119902 | A1 * | 4/2019 | Chen | E04B 1/8218 |
| 2019/0177993 | A1 * | 6/2019 | Shell | E04H 1/125 |
| 2020/0018060 | A1 * | 1/2020 | Watanabe | E04H 1/1205 |
| 2020/0324515 | A1 * | 10/2020 | Hällfors | B32B 21/047 |
| 2020/0340261 | A1 * | 10/2020 | Wang | E04C 2/384 |

FOREIGN PATENT DOCUMENTS

TW       I665413 B       7/2019

* cited by examiner

*Primary Examiner* — William V Gilbert
(74) *Attorney, Agent, or Firm* — MUNCY, GEISSLER, OLDS & LOWE, P.C.

(57) ABSTRACT

A combination type shielding structure includes a top assembly member, a bottom assembly member, and a wall assembly member. The top assembly member is provided on the bottom thereof with a first connector. The wall assembly member is provided on the top thereof with a second connector. The first connector is detachably connected with the second connector. The wall assembly member is provided on the bottom thereof with a third connector. The bottom assembly member is provided on the top thereof with a fourth connector. The third connector is detachably connected with the fourth connector.

5 Claims, 11 Drawing Sheets

COMBINATION TYPE SHIELDING STRUCTURE

BACKGROUND OF THE INVENTION

1. Field of the Invention

The present invention belongs to the building defined in class E04H001/12 of the International Patent Classification and more particularly, to a combination type shielding structure which can be assembled or disassembled quickly.

2. Description of the Related Art

Taiwan Patent No. I665413B disclosed a traditional shielding structure with a ventilation system, such as a telephone booth. As shown in FIG. 1 of the aforementioned patent, the telephone booth 100 includes a wall 120 and a door 140.

However, the traditional shielding structure with the ventilation system as described in the above-mentioned patent is inconvenient for assembly and disassembly. If the shielding structure needs to be relocated, it will cause much inconvenience. Therefore, the configuration design of the traditional shielding structure still needs improvement.

SUMMARY OF THE INVENTION

It is one of the objectives of the present invention to provide a combination type shielding structure which can be assembled or disassembled quickly.

Therefore, the present invention provides a combination type shielding structure which includes a top assembly member, a bottom assembly member, and a wall assembly member disposed between the top assembly member and the bottom assembly member. The top assembly member, the bottom assembly member and the wall assembly member collectively surround and define an accommodating space for accommodating at least one user. The top assembly member is provided on the bottom thereof with a first connector. The wall assembly member is provided on the top thereof with a second connector. The first connector is detachably connected with the second connector. The wall assembly member is provided on the bottom thereof with a third connector. The bottom assembly member is provided on the top thereof with a fourth connector. The third connector is detachably connected with the fourth connector.

As a result, when the shielding structure (e.g. telephone booth) needs to be assembled, the constructor can accomplish the assembly of the shielding structure only by connecting the bottom assembly member, the wall assembly member and the top assembly member in order. The assembly process is quite easy and fast. On the other hand, when the shielding structure needs to be relocated, such as relocation from indoor to outdoor, the constructor can accomplish the disassembly of the entire shielding structure only by reversely disconnecting every assembly member. The disassembly process is also quite easy and fast.

In another aspect of the present invention, the shielding structure may be a telephone booth or a mobile office.

BRIEF DESCRIPTION OF THE DRAWINGS

The detailed configuration, features, and manner of assembly or usage of the combination type shielding structure will be described in the embodiments given herein below and the accompanying drawings, which are given by way of illustration only, and thus are not limitative of the present invention, and wherein.

DETAILED DESCRIPTION OF THE INVENTION

First of all, it is to be mentioned that the technical features provided by the present invention are unlimited to the specific structure, usage and application thereof described in the detailed description of the invention. It should be understood by those having ordinary skill in the art that all the terms used in the contents of the specification are for illustrative description. The directional terms mentioned in the contents of the specification, such as 'front', 'upper', 'lower', 'rear', 'left', 'right', 'top', 'bottom', 'inside', and 'outside', are also just for illustrative description on the basis of normal usage direction, not intended to limit the claimed scope.

Besides, the numeral terms with singular form, such as 'a', 'an' and 'the', used in the claims of the present invention all include the plural meaning. Thus, for example, the description for 'an element' refers to one or a plurality of elements and includes the equivalent replacements known by those having ordinary skill in the art. All conjunctions used in similar conditions should be also understood in the broadest sense. The specific shapes and structural features or technical terms described in the contents of the specification should be also understood to include the equivalently replacing structures or technical terms capable of attaining the function of the specific structures or technical terms.

For specifying the technical features of the present invention, two embodiments and the accompanying drawings are given herein below.

Figure 1:
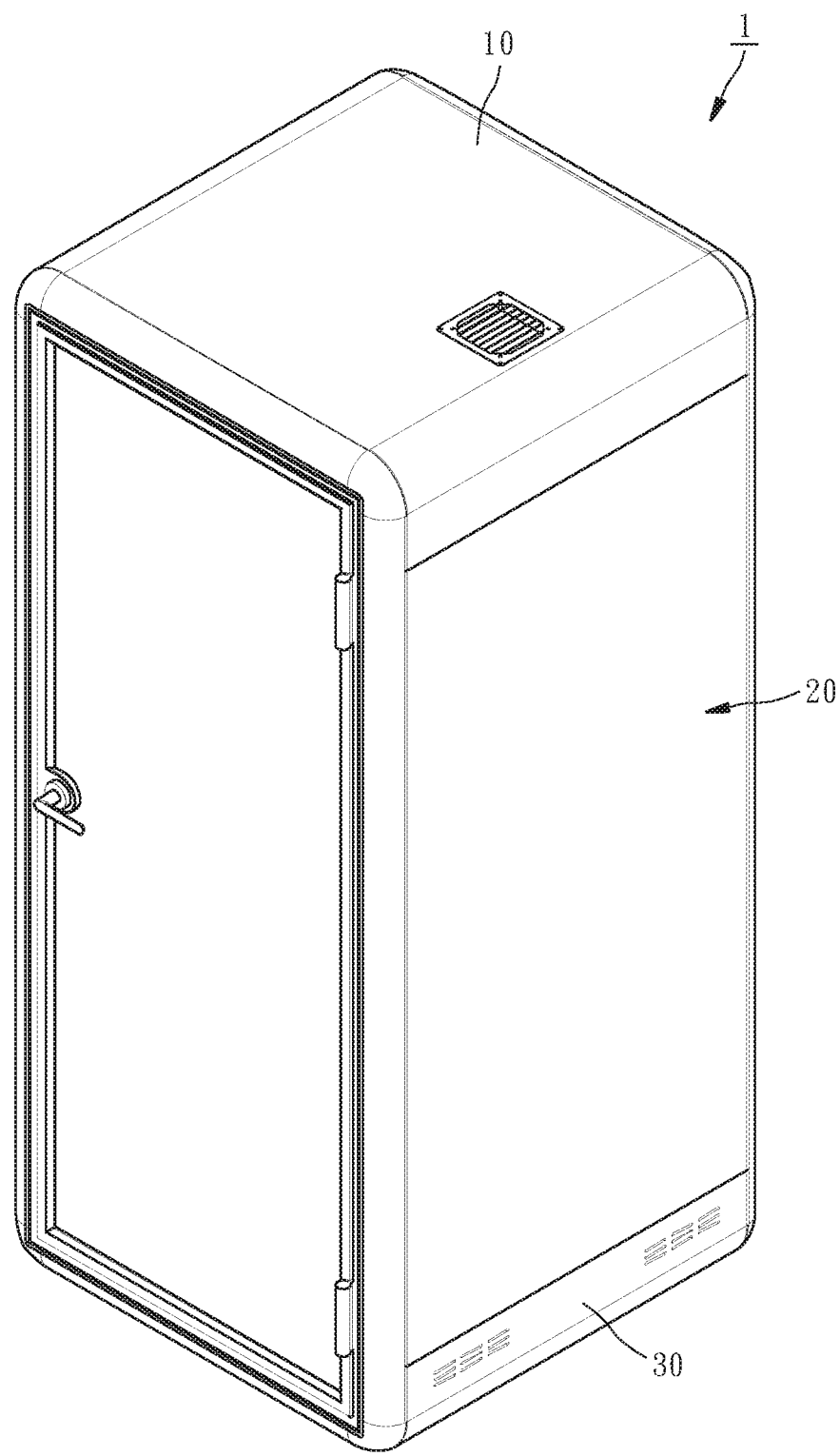
FIG. 1 is a perspective view of a shielding structure of a first embodiment.
Figure 2:
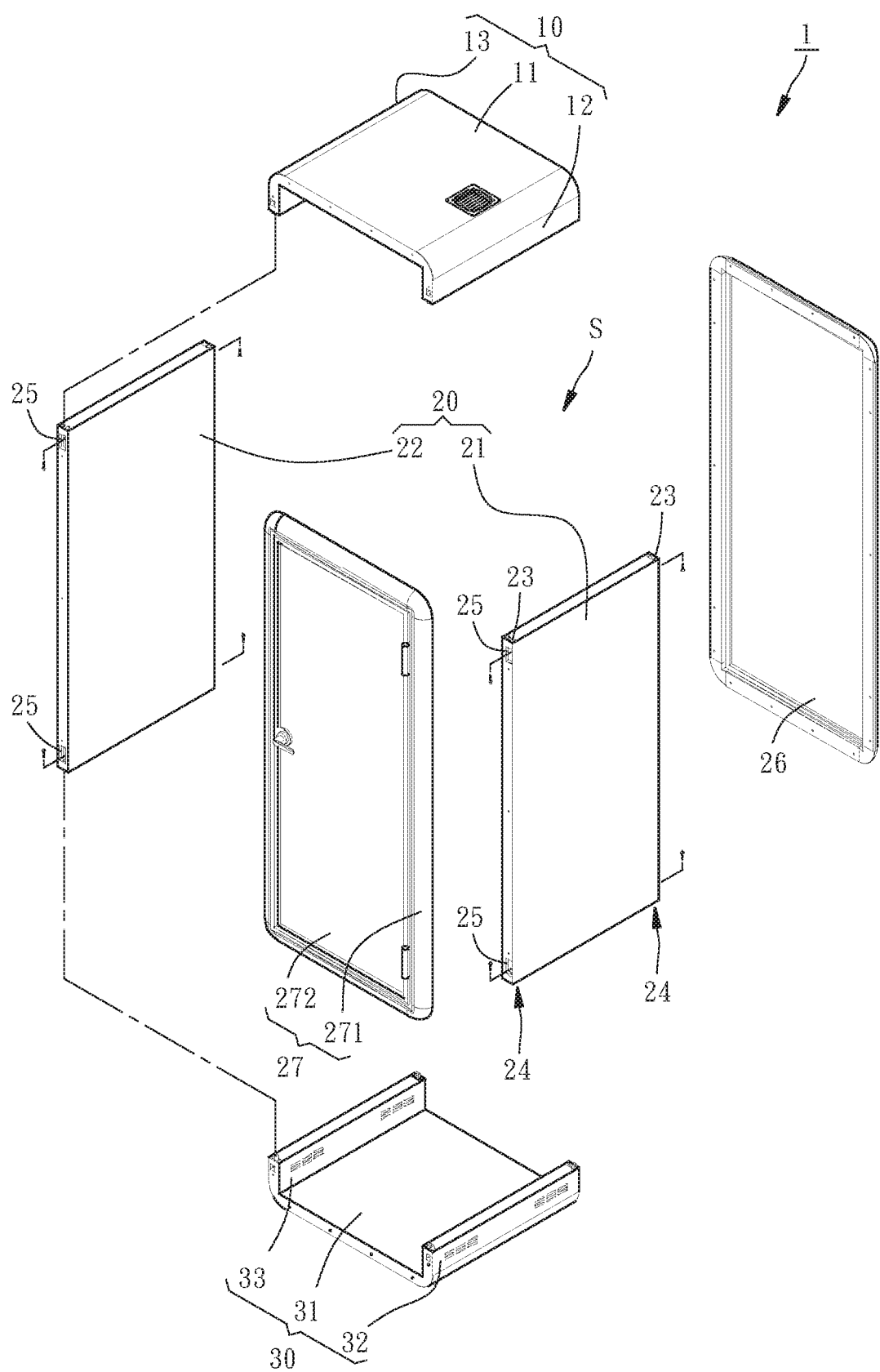
FIG. 2 is an exploded view of FIG. 1.

As shown in FIGS. 1 and 2, a shielding structure 1 provided by a first embodiment is adapted to be a telephone booth. The shielding structure 1 of the first embodiment structurally includes a top assembly member 10, a wall assembly member 20, and a bottom assembly member 30. The wall assembly member 20 is disposed between the top assembly member 10 and the bottom assembly member 30. The top assembly member 10, the bottom assembly member 30 and the wall assembly member 20 collectively surround and define an accommodating space S for accommodating a user, so that the user can make a phone call in the shielding structure 1.

Figure 3:
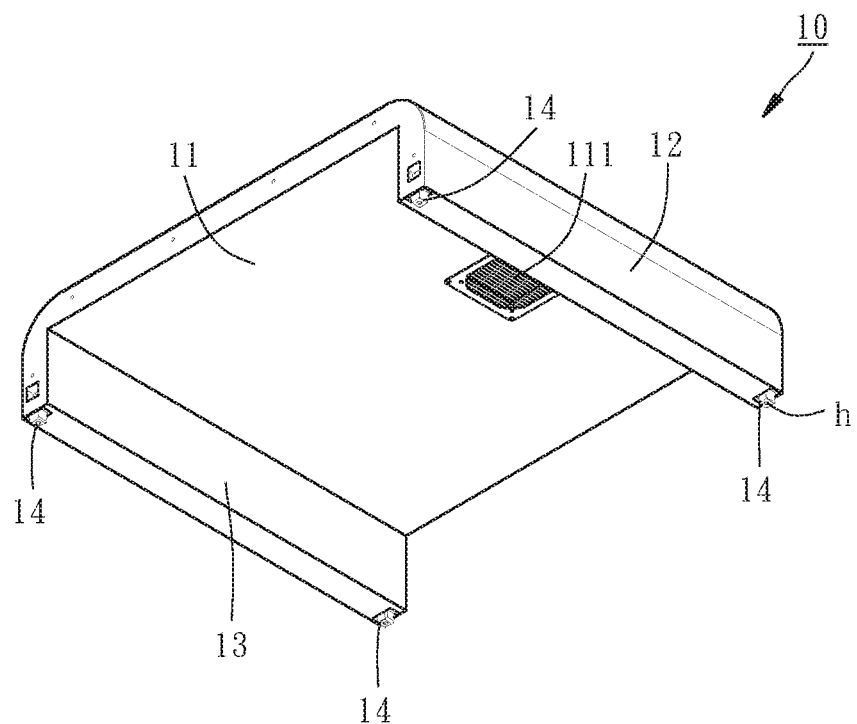
FIG. 3 is a perspective view of a top assembly member of the first embodiment.
Figure 6:
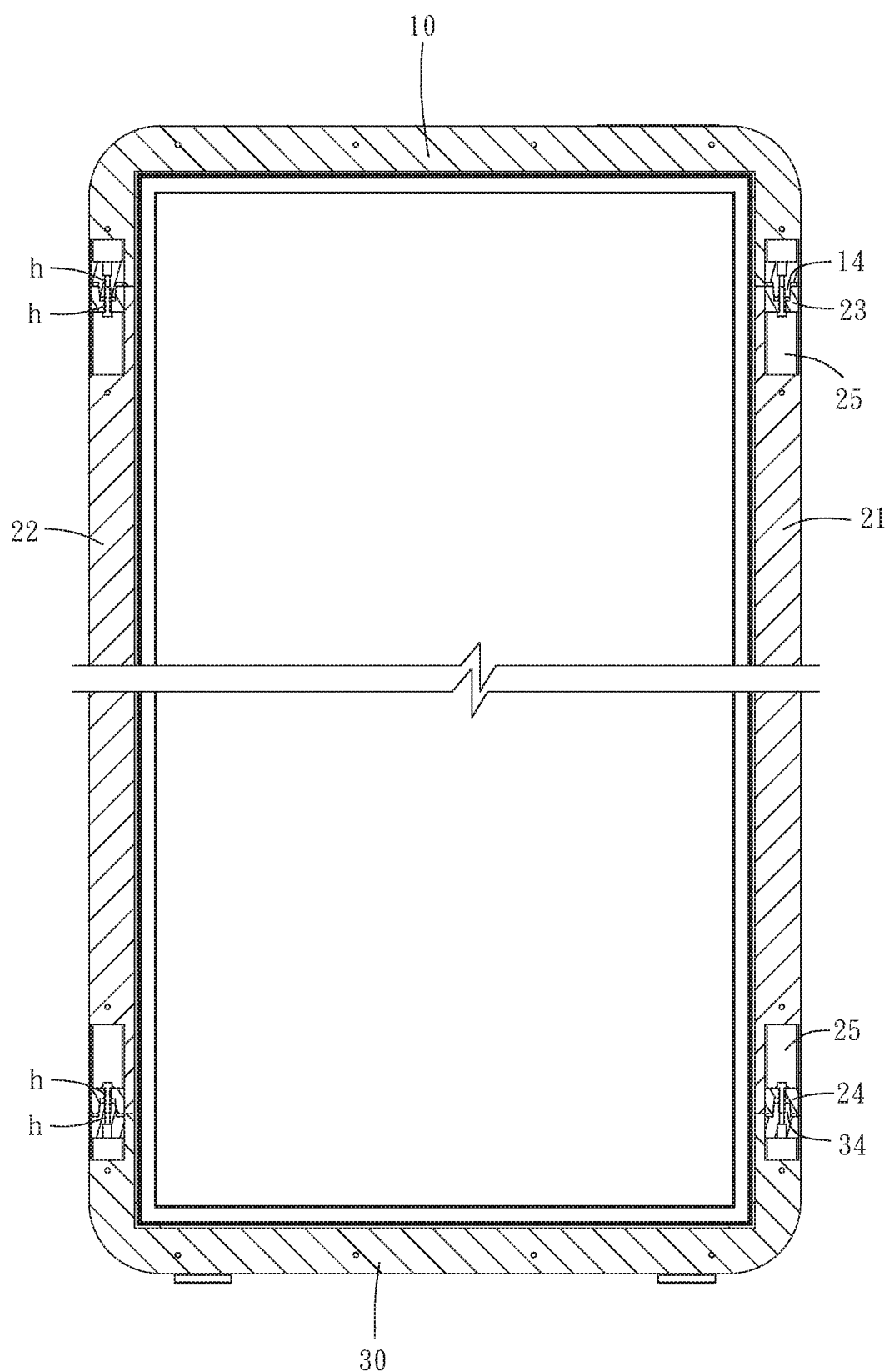
FIG. 6 is a sectional view of FIG. 1.
Figure 7:
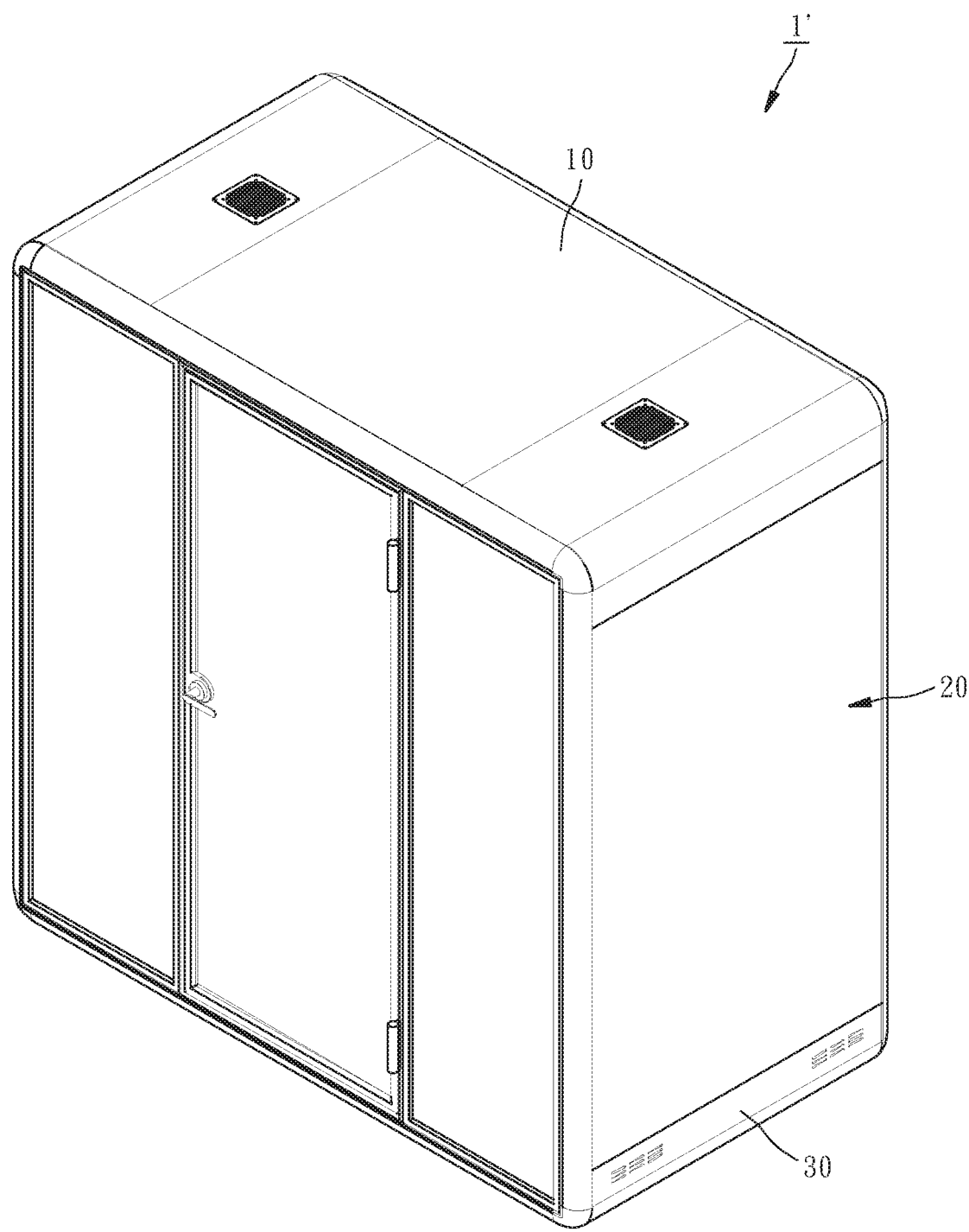
FIG. 7 is a perspective view of a shielding structure of a second embodiment.

Referring to FIG. 2 and FIG. 3, the top assembly member 10 includes a top plate 11, a left upper plate 12, and a right upper plate 13. The left upper plate 12 and the right upper plate 13 are integrally connected to left and right sides of the top plate 11 and extend downwardly. The top plate 11 is provided with a venthole 111 for communicating the outside and inside of the shielding structure 1 with each other. The left upper plate 12 and the right upper plate 13 are both provided on the bottom side thereof with two first connectors 14 separated from each other. Each first connector 14 is configured as a protrusion which protrudes downwardly and having a threaded hole h, as shown in FIG. 6.

Figure 5:
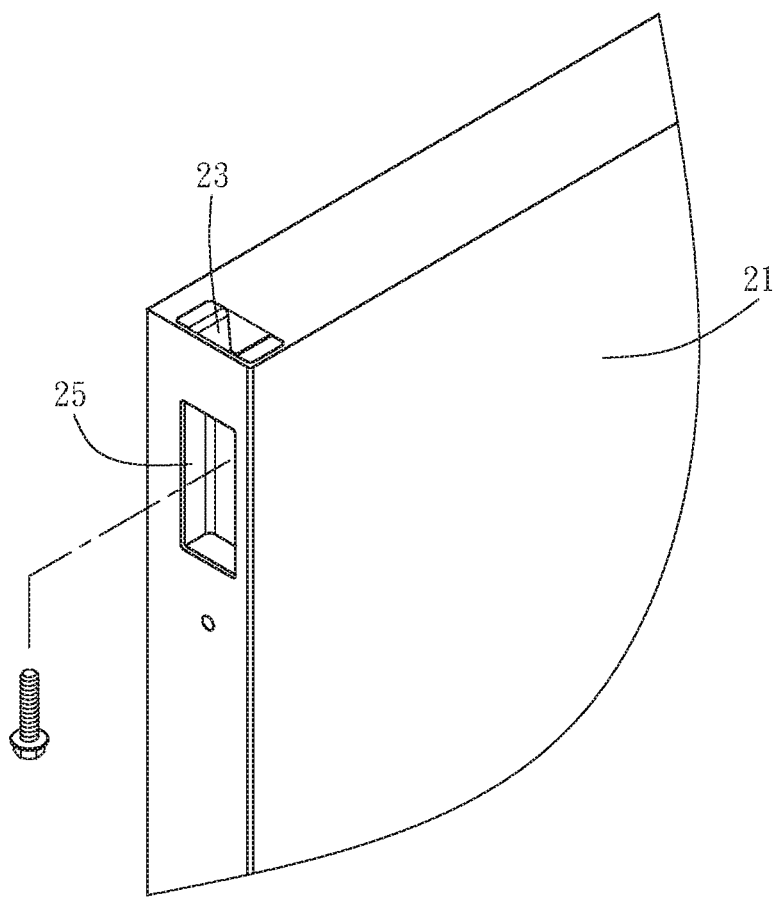
FIG. 5 is a partial perspective enlarged view of a wall assembly member of the first embodiment.

The wall assembly member 20 includes a left wall 21 and a right wall 22. The left wall 21 and the right wall 22 are identical in structure. The left wall 21 and the right wall 22 are both provided on the top thereof with two second connectors 23 and provided on the bottom thereof with two third connectors 24. The second connector 23 is configured as a recess which is provided on the bottom thereof with a threaded hole h. The threaded holes h of the first connectors 14 and the threaded holes h of the second connectors 23 correspond to each other, and the first connectors 14 are detachably connected with the second connectors 23. Besides, the left wall 21 and the right wall 22 are both provided on each of the front side and rear side thereof with two screw inserted holes 25 (as shown in FIG. 5) vertically separated from each other. The screw inserted holes 25 directly communicate with the outside of the wall assembly member 20, and the screw inserted holes 25 are located adjacent to and communicate with the threaded holes h of the second connectors 23 and third connectors 24 one-to-one, that is convenient for the constructor to insert screws through the screw inserted holes 25 to threadedly fasten the top assembly member 10 to the wall assembly member 20.

Figure 4:
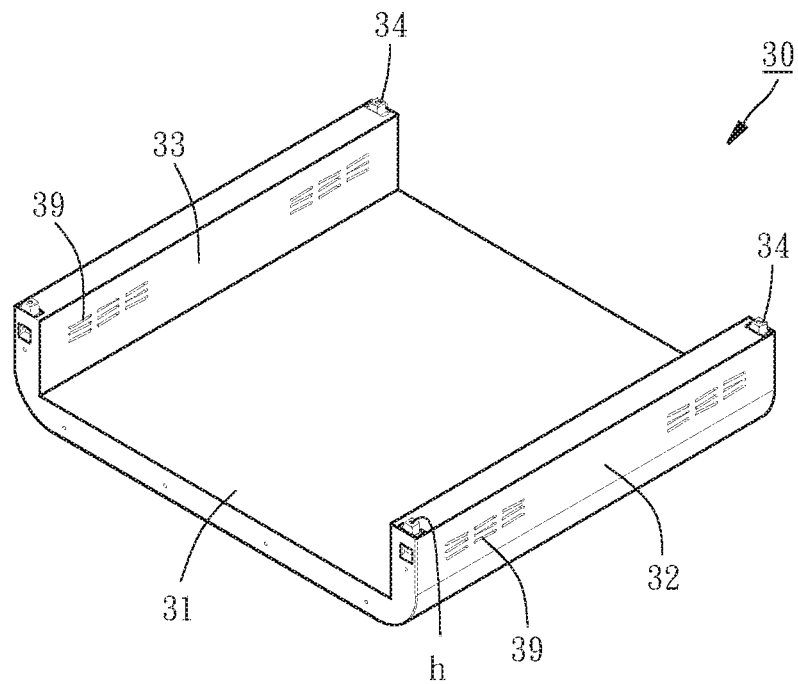
FIG. 4 is a perspective view of a bottom assembly member of the first embodiment.

Referring to FIG. 2 and FIG. 4, the bottom assembly member 30 includes a bottom plate 31, a left lower plate 32, and a right lower plate 33. The left lower plate 32 and the right lower plate 33 are integrally connected to left and right sides of the bottom plate 31. The left lower plate 32 and the right lower plate 33 are both provided with a set of ventholes 39 for communicating the inside and outside of the shielding structure 1 with each other. The left lower plate 32 and the right lower plate 33 are both provided on the top side thereof with two fourth connectors 34 separated from each other. The fourth connector 34 is configured as a protrusion which is provided with a threaded hole h. The threaded holes h of the fourth connectors 34 and the threaded holes h of the third connectors 24 correspond to each other, as shown in FIG. 6, and the third connectors 24 are detachably connected with the fourth connectors 34.

Besides, the shielding structure 1 further has a rear wall assembly member 26 and a front door assembly member 27. The front door assembly member 27 and the rear wall assembly member 26 are fastened to front and rear sides of the wall assembly member 20 respectively. The front door assembly member 27 includes a frame 271 and a door 272. The door 272 is pivotably attached to the frame 271.

Referring to FIG. 2, through the configuration design of the shielding structure 1 of the first embodiment, when the shielding structure 1 needs to be assembled, the constructor only has to place the bottom assembly member 30, combine the wall assembly member 20 with the bottom assembly member 30 by the third connectors 24 and the fourth connectors 34 in a way that the third connectors 24 of the wall assembly member 20 are aimed at the fourth connectors 34 of the bottom assembly member 30, then combine the top assembly member 10 with the wall assembly member 20 by the first connectors 14 and the second connectors 23 in a way that the first connectors 14 of the top assembly member 10 are aimed at the second connectors 23 of the wall assembly member 20, and then insert screws (as shown in FIG. 5) through the screw inserted holes 25 located on the front and rear sides of the left wall 21 and right wall 22 to threadedly fasten the top assembly member 10, the wall assembly member 20 and the bottom assembly member 30 to each other by the screws, as shown in FIG. 6. At last, the front door assembly member 27 and the rear wall assembly member 26 are installed on the front and rear sides of the wall assembly member 20, such that the assembly of the shielding structure 1 is accomplished. The assembly process is quite easy and fast. On the other hand, when the shielding structure 1 needs to be relocated, such as relocation from indoor to outdoor, the constructor can accomplish the disassembly of the shielding structure 1 only by reversely disconnecting every assembly member 27, 26, 10, 20 and 30. The disassembly process is also quite easy and fast.

The present invention further provides a second embodiment. Referring to FIG. 7 to FIG. 12, a shielding structure 1' provided by the second embodiment is adapted to be a mobile office. The shielding structure 1' of the second embodiment is structurally similar to the first embodiment, and includes a top assembly member 10, a wall assembly member 20 and a bottom assembly member 30 as well. The difference between the second embodiment and the first embodiment is described in the following.

Figure 8:
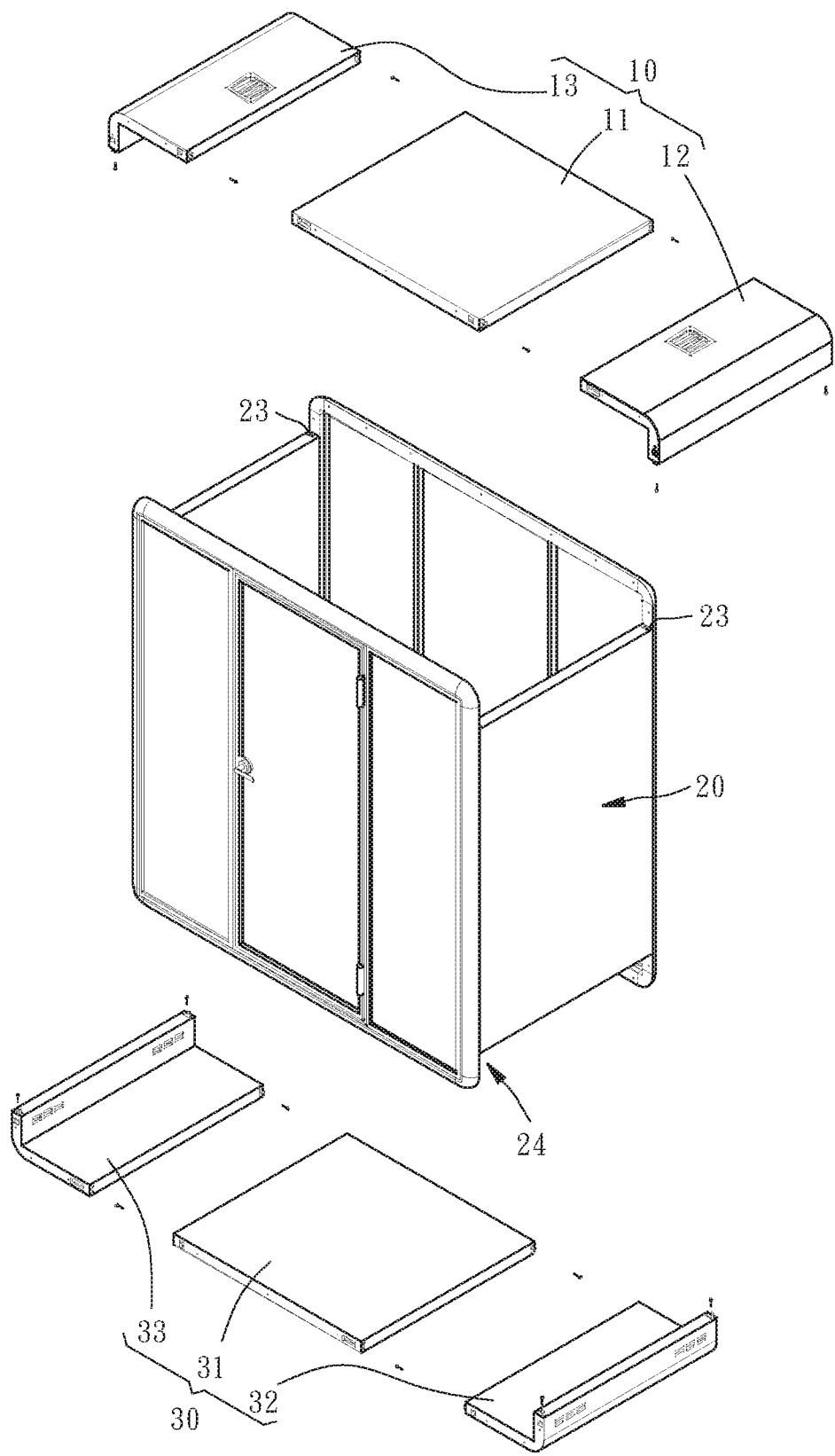
FIG. 8 is an exploded view of FIG. 7.
Figure 9:
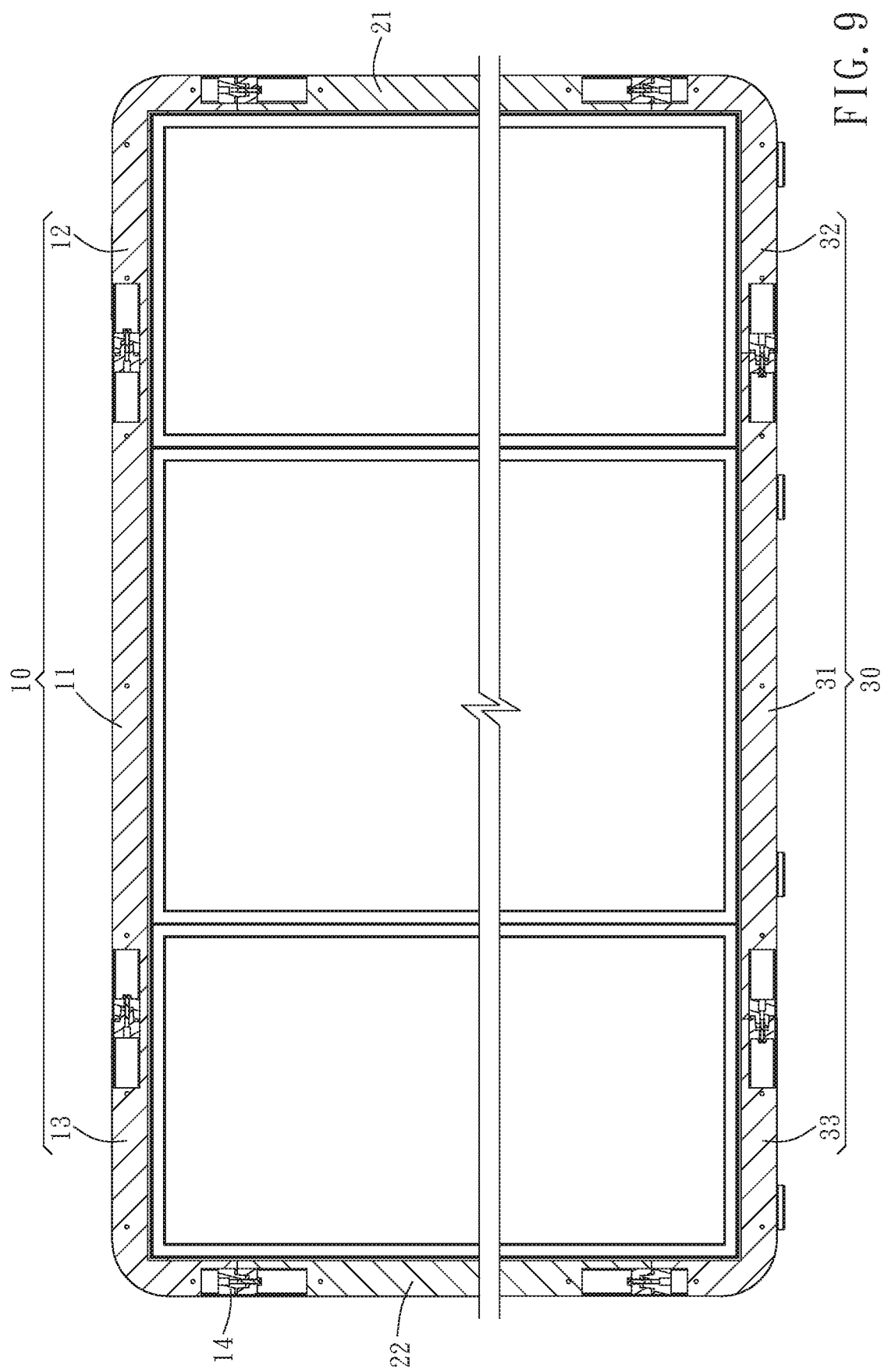
FIG. 9 and FIG. 10 are sectional views of FIG. 7 in different directions.
Figure 10:
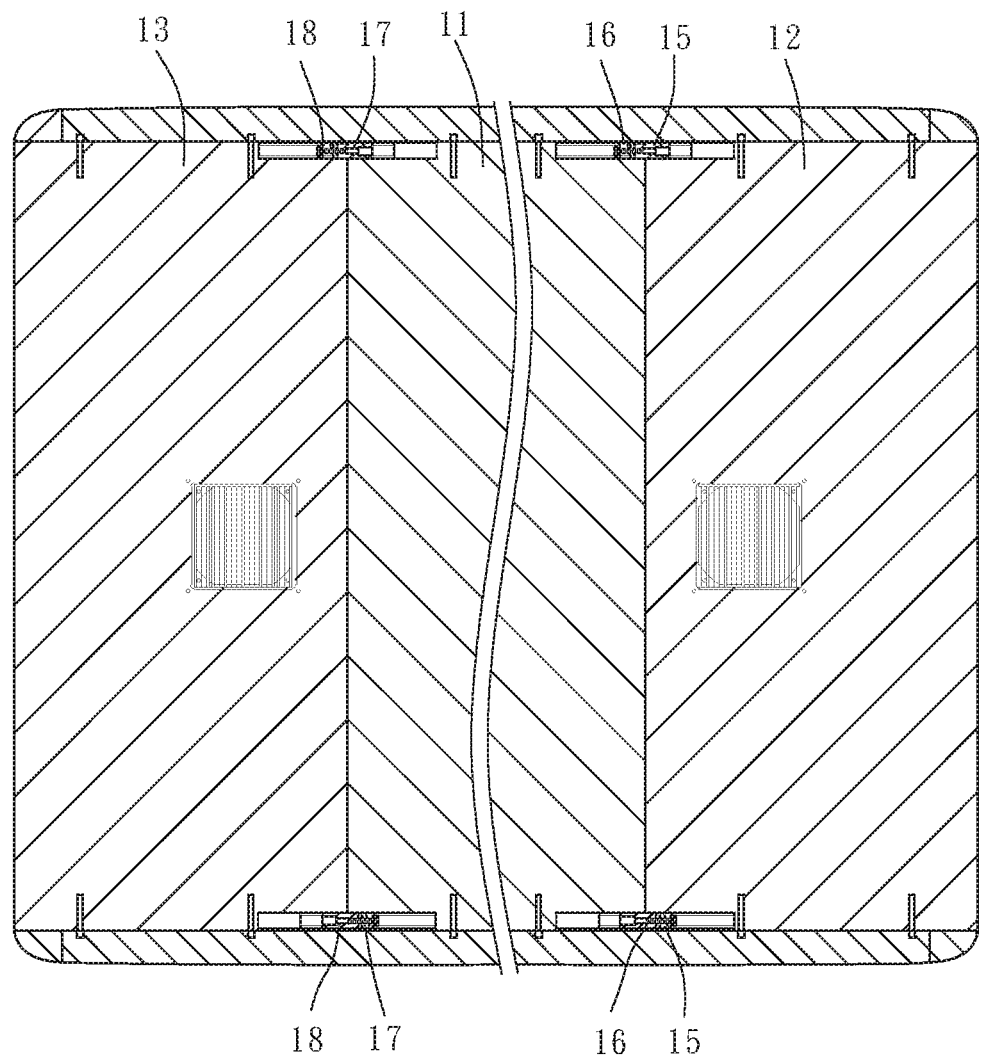
Figure 11:
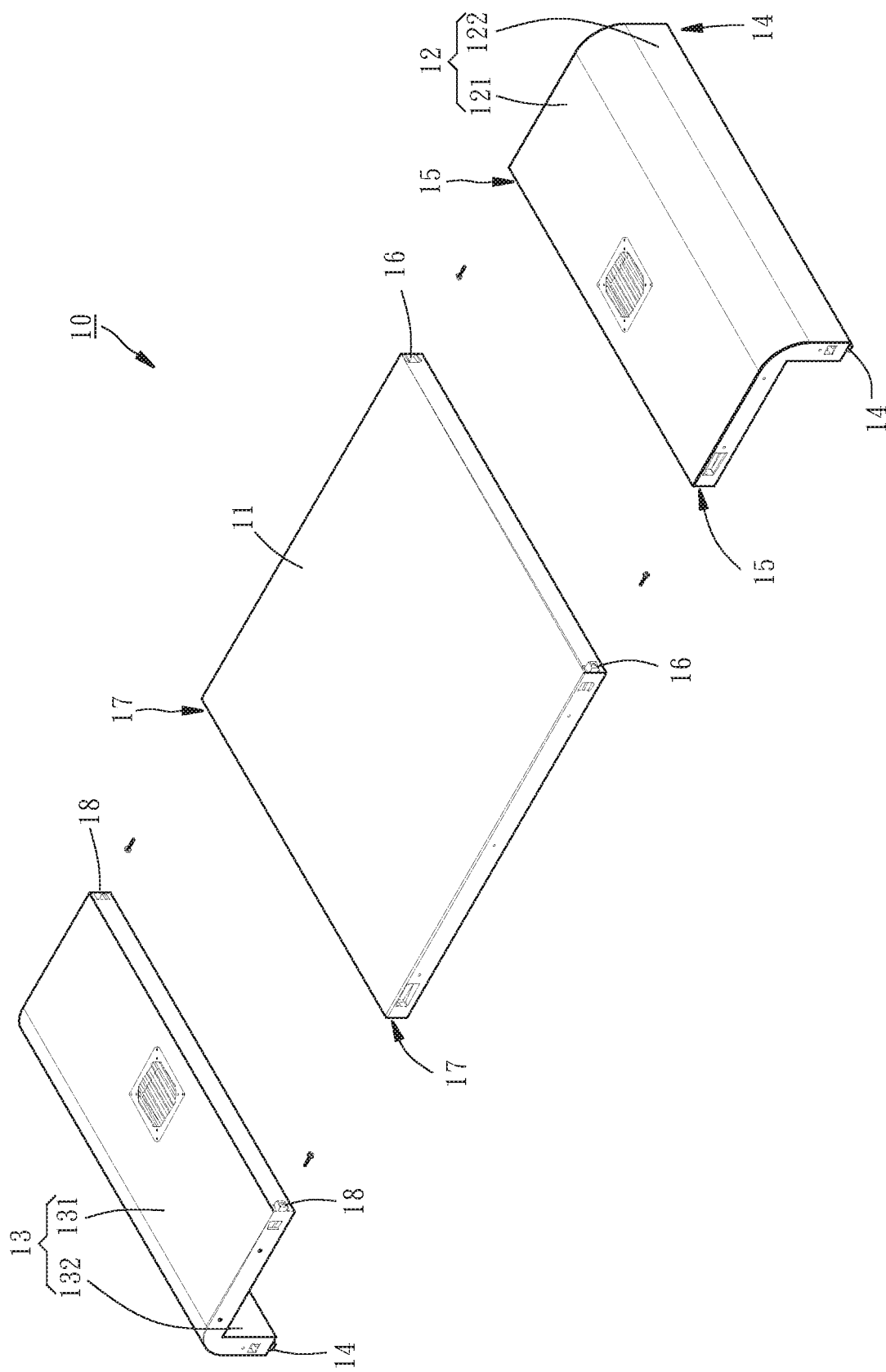
FIG. 11 is an exploded enlarged view of a top assembly member of the second embodiment.

As shown in FIG. 8 and FIG. 11, the top assembly member 10 includes a top plate 11, a left upper plate 12, and a right upper plate 13. The left upper plate 12 includes a left horizontal portion 121 and a left vertical portion 122. The left vertical portion 122 is integrally connected to the left side of the left horizontal portion 121 and extends downwardly. The left vertical portion 122 is provided on the bottom side thereof with two first connectors 14, as shown in FIG. 9. The left horizontal portion 121 is further provided on the right side thereof with two fifth connectors 15, as shown in FIG. 10. The fifth connector 15 located close to the front side of the left upper plate 12 is configured as a recess, as shown in FIG. 10, and the fifth connector 15 located close to the rear side of the left upper plate 12 is configured as a protrusion, as shown in FIG. 10.

The top plate 11 is provided on the left side thereof with two sixth connectors 16 and provided on the right side thereof with two seventh connectors 17. The sixth connector 16 located close to the front side of the top plate 11 is configured as a protrusion, as shown in FIG. 10, and the sixth connector 16 located close to the rear side of the top plate 11 is configured as a recess, as shown in FIG. 10. The seventh connector 17 located close to the front side of the top plate 11 is configured as a recess, as shown in FIG. 10, and the seventh connector 17 located close to the rear side of the top plate 11 is configured as a protrusion, as shown in FIG. 10. The aforementioned two fifth connectors 15 are detachably connected with the aforementioned two sixth connectors 16 corresponding thereto respectively.

The right upper plate 13 includes a right horizontal portion 131 and a right vertical portion 132. The right vertical portion 132 is integrally connected to the right side of the right horizontal portion 131 and extends downwardly. The right vertical portion 132 is provided on the bottom side thereof with two first connectors 14. The right horizontal portion 131 is provided on the left side thereof with two eighth connectors 18. The eighth connector 18 located close to the front side of the right upper plate 13 is configured as a protrusion, as shown in FIG. 10, and the eighth connector 18 located close to the rear side of the right upper plate 13 is configured as a recess, as shown in FIG. 10. The aforementioned two eighth connectors 18 are detachably connected with the aforementioned two seventh connectors 17 corresponding thereto respectively.

Figure 12:
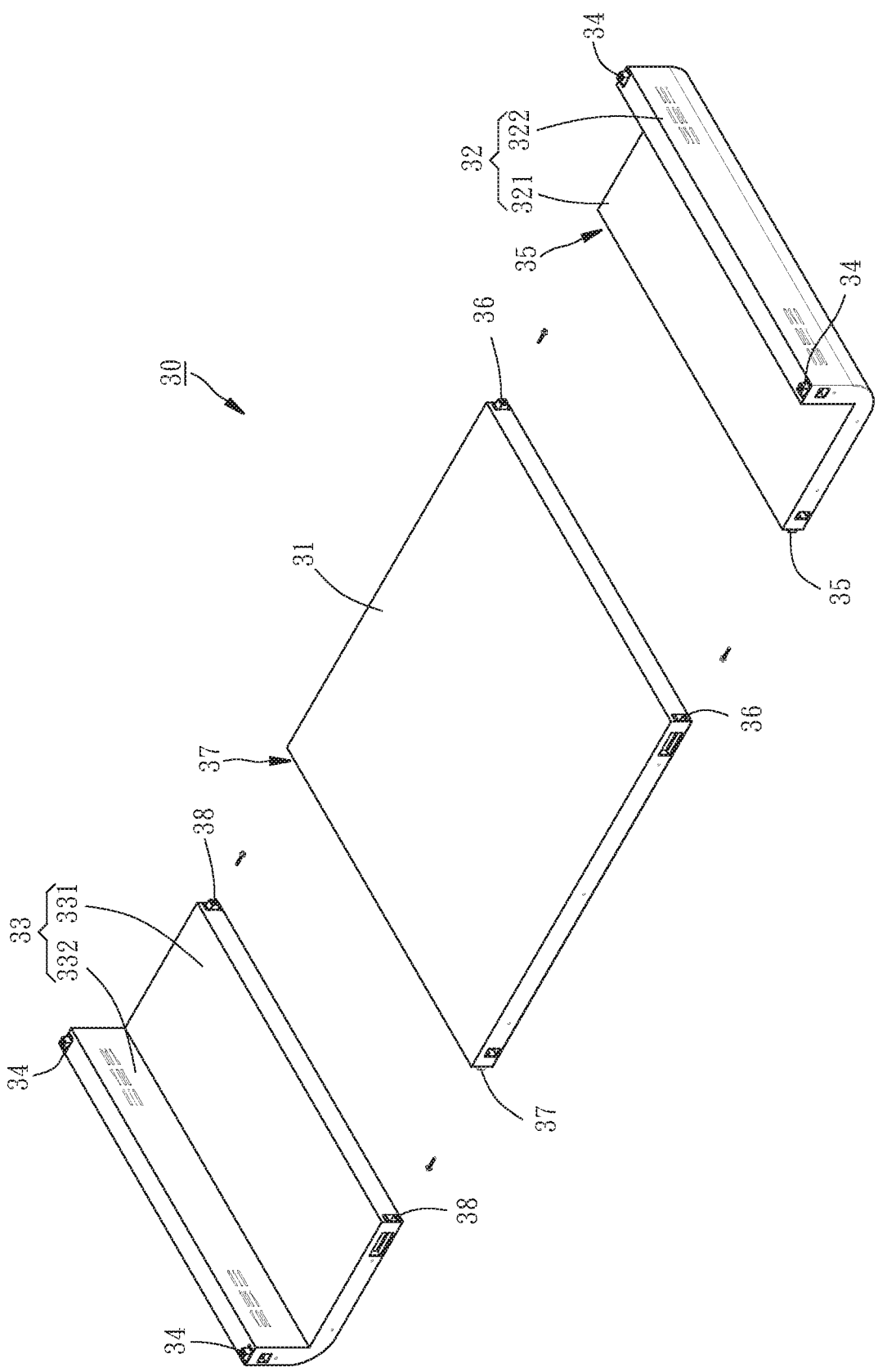
FIG. 12 is an exploded enlarged view of a bottom assembly member of the second embodiment.

Referring to FIG. 12, similar to the top assembly member 10, the bottom assembly member 30 includes a bottom plate 31, a left lower plate 32, and a right lower plate 33. The left lower plate 32 includes a left horizontal portion 321 and a left vertical portion 322. The left vertical portion 322 is integrally connected to the left side of the left horizontal portion 321 and extends upwardly. The left vertical portion 322 is provided on the top side thereof with two fourth connectors 34. The left horizontal portion 321 is provided on the right side thereof with two ninth connectors 35. The ninth connector 35 located close to the front side of the left lower plate 32 is configured as a protrusion, and the ninth connector 35 located close to the rear side of the left lower plate 32 is configured as a recess.

The bottom plate 31 is provided on the left side thereof with two tenth connectors 36 and provided on the right side thereof with two eleventh connectors 37. The tenth connector 36 located close to the front side of the bottom plate 31 is configured as a recess, and the tenth connector 36 located close to the rear side of the bottom plate 31 is configured as a protrusion. The eleventh connector 37 located close to the front side of the bottom plate 31 is configured as a protrusion, and the eleventh connector 37 located close to the rear side of the bottom plate 31 is configured as a recess. The aforementioned two tenth connectors 36 are detachably connected with the aforementioned two ninth connectors 35 corresponding thereto respectively.

The right lower plate 33 includes a right horizontal portion 331 and a right vertical portion 332. The right vertical portion 332 is integrally connected to the right side of the right horizontal portion 331 and extends upwardly. The right vertical portion 332 is provided on the top side thereof with two fourth connectors 34. The right horizontal portion 331 is provided on the left side thereof with two twelfth connectors 38. The twelfth connector 38 located close to the front side of the right lower plate 33 is configured as a recess, and the twelfth connector 38 located close to the rear side of the right lower plate 33 is configured as a protrusion. The aforementioned two twelfth connectors 38 are detachably connected with the aforementioned two eleventh connectors 37 corresponding thereto respectively.

Through the configuration design of the shielding structure 1' of the second embodiment, it is also convenient for the constructor to assemble or disassemble the shielding structure 1'.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A combination shielding structure comprising a top assembly member, a bottom assembly member, and a wall assembly member disposed between the top assembly member and the bottom assembly member, the top assembly member, the bottom assembly member and the wall assembly member collectively surrounding and defining an accommodating space for accommodating at least one user, wherein the top assembly member is provided on a bottom thereof with a first connector, the wall assembly member is provided on a top thereof with a second connector, and the first connector is detachably connected with the second connector;

the wall assembly member is provided on a bottom thereof with a third connector, the bottom assembly member is provided on a top thereof with a fourth connector, and the third connector is detachably connected with the fourth connector; wherein the third connector and the fourth connector are both provided with a threaded hole; the threaded hole of the third connector and the threaded hole of the fourth connector correspond to each other; the wall assembly member further comprises a bottom screw inserted hole; the bottom screw inserted hole is located adjacent to the threaded hole of the third connector; the bottom screw inserted hole directly communicates with an outside of the wall assembly member and communicates with the threaded hole of the third connector;

wherein the top assembly member comprises a top plate, a first upper plate and a second upper plate; the first upper plate and the second upper plate are integrally connected to first and second sides of the top plate respectively; the top assembly member comprises two said first connectors and the two said first connectors are provided on bottom sides of the first upper plate and the second upper plate respectively; the wall assembly member comprises a first wall and a second wall; the wall assembly member comprises two said second connectors and the two said second connectors are provided on top sides of the first wall and the second wall respectively;

wherein the bottom assembly member comprises a bottom plate, a first lower plate and a second lower plate; the first lower plate and the second lower plate are integrally connected to first and second sides of the bottom plate respectively; the bottom assembly member comprises two said fourth connectors and the two said fourth connectors are provided on top sides of the first lower plate and the second lower plate respectively; the wall assembly member comprises two said third connectors and the two said third connectors are provided on bottom sides of the first wall and the second wall respectively;

wherein each of the first said connectors and the second said connectors are provided with a threaded hole; the threaded holes of the first said connectors and the threaded holes of the second said connectors correspond to each other; the wall assembly member further comprises two top screw inserted holes; the top screw inserted holes are located adjacent to the threaded holes of the second said connectors respectively; the top screw inserted holes each directly communicate with an outside of the wall assembly member and communicate with the threaded holes of the second said connectors respectively;

wherein the combination shielding structure further comprises two top screws and two bottom screws that are vertically arranged; the top screws and the bottom screws each comprise a head portion and a thread rod portion connected to the head portion, wherein when the top assembly member and the wall assembly member are assembled, the head portions of the top screws each are located inside the top screw inserted holes respectively, and the thread rod portions of the top screws each have a distal end located in the threaded holes of the first connectors respectively; when the bottom assembly member and the wall assembly member are assembled, the head portions of the bottom screws each are located inside the bottom screw inserted holes respectively, and the thread rod portions of the bottom screws each have a distal end located in the threaded holes of the two said fourth connectors respectively.

2. The combination shielding structure as claimed in claim 1, wherein each of the first said connectors is configured as a protrusion and each of the second said connectors is configured as a recess.

3. The combination shielding structure as claimed in claim 1, wherein each of the fourth said connectors is configured as a protrusion and each of the third said connectors is configured as a recess.

4. The combination shielding structure as claimed in claim 1, wherein the first upper plate comprises a first horizontal portion and a first vertical portion; the first vertical portion is integrally connected with the first horizontal portion and extends downwardly; the second upper plate comprises a second horizontal portion and a second vertical portion; the second vertical portion is integrally connected with the second horizontal portion and extends downwardly; the two first said connectors are provided on bottom sides of the first vertical portion and the second vertical portion respectively; the two second said connectors are provided on top sides of the first wall and the second wall respectively; the first horizontal portion is provided on a second side thereof with a fifth connector; the top plate is provided on a first side and a second side thereof with a sixth connector and a seventh connector respectively; the second horizontal portion is provided on a first side thereof with an eighth connector; the fifth connector is detachably connected with the sixth connector; the seventh connector is detachably connected with the eighth connector, wherein the first horizontal portion and the second horizontal portion are disposed in a plane as same as a plane that the top plate is disposed in, and the first vertical portion and the second vertical portion are disposed in a plane perpendicular to the plane of the first horizontal portion and the second horizontal portion.

5. The combination shielding structure as claimed in claim 1, wherein the first lower plate comprises a first horizontal portion and a first vertical portion; the first vertical portion is integrally connected with the first horizontal portion and extends upwardly; the second upper plate comprises a second horizontal portion and a second vertical portion; the second vertical portion is integrally connected with the second horizontal portion and extends upwardly; the two said fourth connectors are provided on top sides of the first vertical portion and the second vertical portion respectively; the third said connectors and the third connectors are provided on bottom sides of the first wall and the second wall respectively; the first horizontal portion is provided on a second side thereof with a ninth connector; the bottom plate is provided on a first side and a second side thereof with a tenth connector and an eleventh connector respectively; the second horizontal portion is provided on a first side thereof with a twelfth connector; the ninth connector is detachably connected with the tenth connector; the eleventh connector is detachably connected with the twelfth connector.

\* \* \* \* \*